(12) United States Patent  
Okada

(10) Patent No.: US 12,107,566 B2  
(45) Date of Patent: Oct. 1, 2024

(54) ACOUSTIC WAVE FILTER

(71) Applicant: Murata Manufacturing Co., Ltd., Nagaokakyo (JP)

(72) Inventor: Keiji Okada, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 405 days.

(21) Appl. No.: 17/691,492

(22) Filed: Mar. 10, 2022

(65) Prior Publication Data

US 2022/0200570 A1    Jun. 23, 2022

Related U.S. Application Data

(63) Continuation of application No. PCT/JP2020/029725, filed on Aug. 3, 2020.

(30) Foreign Application Priority Data

Sep. 13, 2019   (JP) .................................. 2019-166855

(51) Int. Cl.
*H03H 9/54*   (2006.01)
*H03H 9/13*   (2006.01)
(Continued)

(52) U.S. Cl.
CPC .............. *H03H 9/542* (2013.01); *H03H 9/13* (2013.01); *H03H 9/14544* (2013.01);
(Continued)

(58) Field of Classification Search
CPC .......... H03H 9/17; H03H 9/568; H03H 9/542; H03H 9/02929; H03H 9/6483;
(Continued)

(56) References Cited

U.S. PATENT DOCUMENTS

2006/0125349 A1* 6/2006 Inoue ................. H03H 9/14588
   310/313 D
2010/0109801 A1* 5/2010 Inoue ..................... H03H 9/725
   333/186
(Continued)

FOREIGN PATENT DOCUMENTS

JP    51-113343 U    9/1976
JP    51113343    *    9/1976
(Continued)

OTHER PUBLICATIONS

Official Communication issued in International Patent Application No. PCT/JP2020/029725, mailed on Sep. 29, 2020.

*Primary Examiner* — Daniel L Murphy
*Assistant Examiner* — Amie M Ndure
(74) *Attorney, Agent, or Firm* — Keating & Bennett, LLP

(57) ABSTRACT

An acoustic wave filter includes at least three segmented resonator devices connected in series to one another and aligned in a direction that crosses an acoustic wave propagation direction and each including an InterDigital Transducer (IDT) electrode, and centers of respective IDT electrodes of an adjacent pair of the at least three segmented resonator devices in the acoustic wave propagation direction are not aligned when seen from a direction orthogonal to the acoustic wave propagation direction.

18 Claims, 9 Drawing Sheets

(51) Int. Cl.
  *H03H 9/145* (2006.01)
  *H03H 9/17* (2006.01)
  *H03H 9/56* (2006.01)
  *H03H 9/60* (2006.01)
  *H03H 9/64* (2006.01)

(52) U.S. Cl.
  CPC .............. *H03H 9/17* (2013.01); *H03H 9/568* (2013.01); *H03H 9/605* (2013.01); *H03H 9/6483* (2013.01)

(58) Field of Classification Search
  CPC ...... H03H 9/605; H03H 9/13; H03H 9/14544; H03H 9/02992; H03H 15/00; H03H 15/02; H03H 2009/02519; H03H 3/0077; H03H 7/0138; H03H 9/02259; H03H 9/2494; H03H 9/02574; H03H 9/14538; H03H 9/64; H03H 9/643; H03H 9/6433; H03H 9/02834; H03H 9/6426; G01H 9/00; G01H 5/00; G01H 9/008; G01H 11/08; G01H 13/00; G01H 15/00; G01H 17/00; H04B 11/00
  USPC .......................................... 367/178
  See application file for complete search history.

(56) References Cited

U.S. PATENT DOCUMENTS

| | | |
|---|---|---|
| 2010/0148887 A1 | 6/2010 | Matsuda et al. |
| 2011/0215884 A1* | 9/2011 | Fujiwara ............. H03H 9/6483 333/195 |
| 2012/0126913 A1 | 5/2012 | Hara et al. |
| 2013/0113576 A1* | 5/2013 | Inoue ...................... H03H 9/70 333/195 |
| 2016/0049920 A1 | 2/2016 | Kishino |
| 2016/0118956 A1 | 4/2016 | Kihara et al. |
| 2018/0278238 A1* | 9/2018 | Kuroyanagi ............. H03H 9/70 |
| 2019/0149131 A1* | 5/2019 | Kido ...................... H03H 9/706 455/338 |
| 2019/0260351 A1* | 8/2019 | Itou ...................... H03H 9/0566 |
| 2019/0305746 A1 | 10/2019 | Ota |
| 2019/0312568 A1 | 10/2019 | Isaka et al. |
| 2019/0356302 A1* | 11/2019 | Yasuda .................... H03H 9/70 |
| 2019/0393861 A1* | 12/2019 | Nosaka ...................... H03H 9/72 |
| 2020/0162057 A1* | 5/2020 | Nakamura ............ H03H 9/725 |
| 2020/0220518 A1 | 7/2020 | Omura |
| 2020/0328728 A1* | 10/2020 | Nakagawa ........... H04B 1/0057 |
| 2020/0412335 A1* | 12/2020 | Takata ................ H03H 9/6436 |

FOREIGN PATENT DOCUMENTS

| | | | |
|---|---|---|---|
| JP | 2001-156588 A | 6/2001 | |
| JP | 2011040817 A * | 2/2011 | ............ H03H 9/568 |
| JP | 2011172191 A * | 9/2011 | |
| JP | 2019-186726 A1 | 10/2019 | |
| WO | 2009/063559 A1 | 5/2009 | |
| WO | 2014/133084 A1 | 9/2014 | |
| WO | 2015/002047 A1 | 1/2015 | |
| WO | 2018/123775 A1 | 7/2018 | |
| WO | WO-2019065666 A1 * | 4/2019 | ........... H01L 41/047 |

\* cited by examiner

ACOUSTIC WAVE FILTER

CROSS REFERENCE TO RELATED APPLICATIONS

This application claims the benefit of priority to Japanese Patent Application No. 2019-166855 filed on Sep. 13, 2019 and is a Continuation Application of PCT Application No. PCT/JP2020/029725 filed on Aug. 3, 2020. The entire contents of each application are hereby incorporated herein by reference.

BACKGROUND OF THE INVENTION

1. Field of the Invention

The present invention relates to an acoustic wave filter including segmented resonator devices.

2. Description of the Related Art

In general, a technique of forming a resonator group by connecting a plurality of acoustic wave resonators in series, that is to say, a technique of dividing an acoustic wave resonator into a plurality of segmented resonators that are connected in series to each other is known in the art (for example, Japanese Unexamined Patent Application Publication No. 2001-156588). By dividing an acoustic wave resonator in such a way, it becomes possible to reduce power consumption per unit area, and this improves the electric power handling capability of the acoustic wave filter.

SUMMARY OF THE INVENTION

However, when an acoustic wave resonator is divided into three or more segmented resonators connected in series, it means that, of the three or more segmented resonators, there is a segmented resonator arranged in such a manner as to be interposed between other segmented resonators. Further, because of the interaction between such a segmented resonator and adjacent segmented resonators sandwiching such a segmented resonator, the temperature of the acoustic wave filter is likely to increase. As a result, there is a problem of degrading electric power handling capability of the acoustic wave filter.

Preferred embodiments of the present invention provide acoustic wave filters that each enable effective improvement in an electric power handling capability.

An acoustic wave filter according to one aspect of a preferred embodiment of the present invention includes at least three segmented resonator devices connected in series to one another and aligned in a direction that crosses an acoustic wave propagation direction, wherein each of the at least three segmented resonator devices includes an Inter-Digital Transducer (IDT) electrode, and centers of respective IDT electrodes of an adjacent pair of the at least three segmented resonator devices in the acoustic wave propagation direction are not aligned when seen from a direction orthogonal to the acoustic wave propagation direction.

According to preferred embodiments of the present invention, it is possible to provide acoustic wave filters that each enable an effective improvement of the electric power handling capability.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
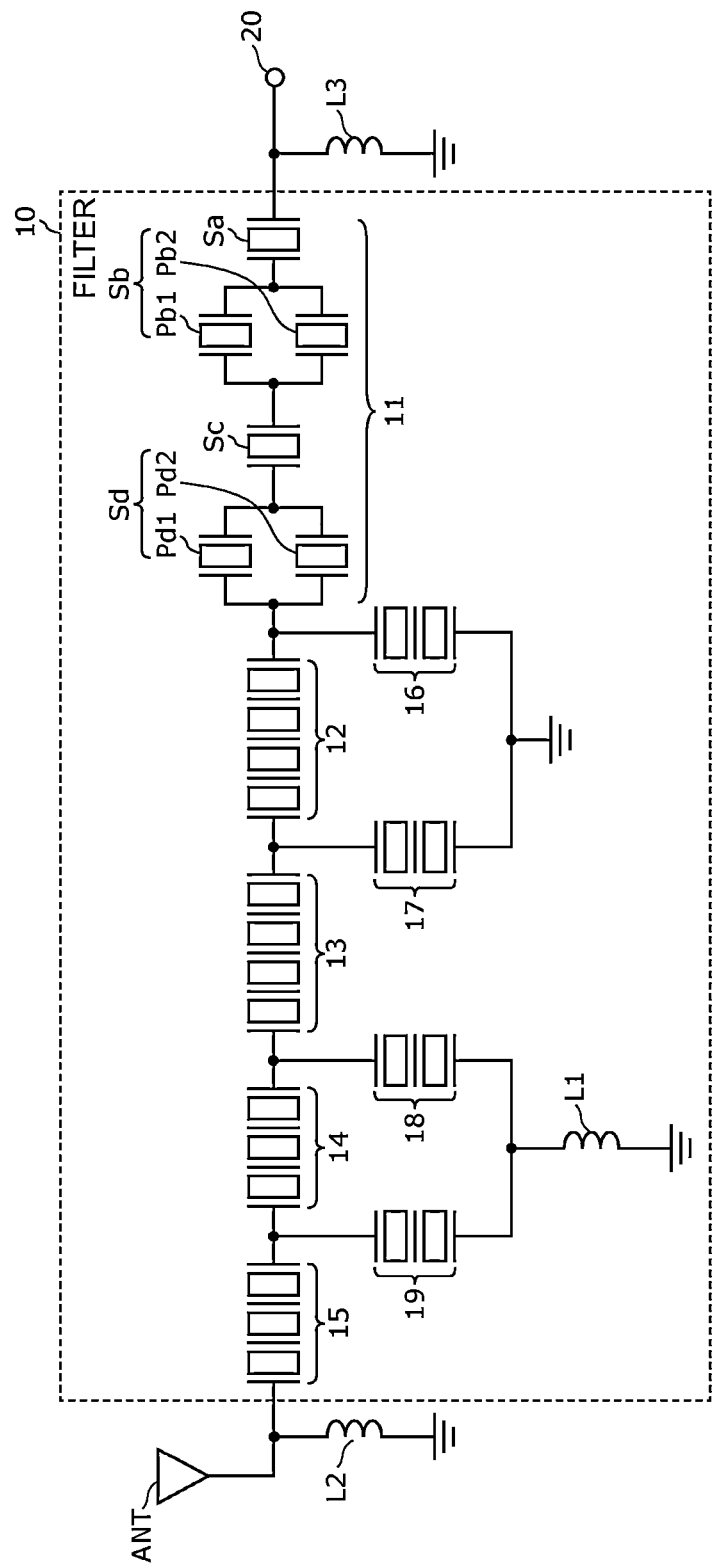
FIG. 1 is a circuit configuration diagram of a filter according to a preferred embodiment of the present invention.

Hereinafter, preferred embodiments of the present invention will be described in detail with reference to the drawings. Note that the preferred embodiments, which will be described below, each illustrate a comprehensive or specific example. Numeric values, shapes, materials, constituent elements, arrangements and connection modes of the constituent elements, and the like illustrated in the following preferred embodiments are mere examples, and not intended to limit the present invention. Of elements or features included in the following preferred embodiments, the elements or features not recited in an independent claim will be described as optional. Further, in the drawings, the same reference numeral is given to substantially the same elements, and in some cases an overlapping description is omitted or simplified. Further, in the following description of preferred embodiments, the term "connect" means not only the case of direct/ connection, but also means the case where an electrical connection is established with another element or the like interposed therebetween.

First Preferred Embodiment

A configuration of an acoustic wave filter device according to a first preferred embodiment is described with reference to FIG. 1.

FIG. 1 is a circuit configuration diagram of a filter 10 according to a preferred embodiment of the present invention. FIG. 1 also illustrates an antenna ANT and inductors L2 and L3 that are connected to the filter 10. The antenna element ANT is a multiband antenna complying with communication standards such as, for example, LTE (Long Term Evolution) and the like for transmitting and receiving radio frequency signals. The inductor L2 is a matching circuit for providing impedance matching between the filter 10 and the antenna ANT, and the inductor L3 is a matching circuit for providing impedance matching between the filter 10 and a circuit to be connected to a terminal 20 (for example, an amplifier circuit, a switch, an RFIC (Radio Frequency Integrated Circuit), or the like).

The filter 10 is an acoustic wave filter including acoustic wave resonators. Each acoustic wave resonator included in the filter 10 may be either a surface acoustic wave resonator or an acoustic wave resonator that uses a BAW (Bulk Acoustic Wave). Usable surface acoustic waves also include, for example, a surface wave, a Love wave, a leaky wave, a Rayleigh wave, a boundary wave, a leaky SAW, a pseudo SAW, and a plate wave.

The filter 10 includes series arm resonators 11, 12, 13, 14, and 15, parallel arm resonators 16, 17, 18, and 19, and an inductor L1. The series arm resonators 11, 12, 13, 14, and 15 and the parallel arm resonators 16, 17, 18, and 19 define a pass band of the filter 10. The inductor L1 is capable of adjusting the pass band of the filter 10. Note that the filter 10 does not need include the inductor L1. Further, in order to provide a desired pass band from the pass band, the filter 10 may include another impedance element (inductor, capacitor, or the like).

The series arm resonators 11, 12, 13, 14, and 15 are connected in series to each other in a path connecting the antenna ANT and the terminal 20. The parallel arm resonator 16 is connected between ground and a node in the foregoing path between the series arm resonator 11 and the series arm resonator 12. The parallel arm resonator 17 is connected between the ground and a node in the foregoing path between the series arm resonator 12 and the series arm resonator 13. The parallel arm resonator 18 is connected between the ground and a node in the foregoing path between the series arm resonator 13 and the series arm resonator 14. The parallel arm resonator 19 is connected between the ground and a node in the foregoing path between the series arm resonator 14 and the series arm resonator 15.

According to the foregoing configuration of the filter 10, the series arm resonators 11, 12, 13, 14, and 15, which include acoustic wave resonators, are arranged in a series arm path, and the parallel arm resonators 16, 17, 18, and 19, which include acoustic wave resonators, are arranged in parallel arm paths. This makes it possible to realize a ladder acoustic wave filter that has a low loss pass band and a steep transition band in the range from the pass band to a stop band.

Each of the series arm resonators 11, 12, 13, 14, and 15 and the parallel arm resonators 16, 17, 18, and 19 is a segmented resonator device group including a plurality of segmented resonator devices connected in series to each other. The segmented resonator device group refers to an acoustic wave resonator in which a connection node between adjacent segmented resonator devices, which are included in this segmented resonator device group and are connected in series, is not connected to any other element other than these adjacent segmented resonator devices. For example, no other element is connected between the adjacent segmented resonator devices, and the connection node between these adjacent segmented resonator devices is not connected to the ground or the like. By dividing the acoustic wave resonator in this way, it becomes possible to reduce the power consumption per unit area and improve the electric power handling capability of the filter 10.

However, when an acoustic wave resonator is divided into three or more segmented resonators connected in series, it means that, of the three or more segmented resonators, there is a segmented resonator interposed between other segmented resonators. Further, because of the interaction between such a segmented resonator and adjacent segmented resonators sandwiching such a segmented resonator, the temperature of the acoustic wave filter is likely to increase. As a result, there is a problem of degrading electric power handling capability of the acoustic wave filter.

Hereinafter, the description is provided focusing on the series arm resonator 11 to which various preferred embodiments of the present invention are applied to resolve such a problem.

The filter 10 includes, as the series arm resonator 11, at least three segmented resonator devices that are connected in series to each other. Here, these at least three segmented resonator devices are segmented resonator devices Sa, Sb, Sc, and Sd that are connected in series to each other. Of the at least three segmented resonator devices, two adjacent segmented resonator devices are referred to as a first segmented resonator device and a second segmented resonator device. Here, the first segmented resonator device includes at least two segmented resonators that are connected in parallel to each other. In other words, the first segmented resonator device is divided in parallel into two segmented resonators. For example, when focused on the segmented resonator devices Sa and Sb, the segmented resonator device Sb is the first segmented resonator device, and the segmented resonator device Sa is the second segmented resonator device. For example, when focused on the segmented resonator devices Sb and Sc, the segmented resonator device Sb is the first segmented resonator device, and the segmented resonator device Sc is the second segmented resonator device. For example, when focused on the segmented resonator devices Sc and Sd, the segmented resonator device Sd is the first segmented resonator device, and the segmented resonator device Sc is the second segmented resonator device.

In this case, the number of the segmented resonators of the first segmented resonator device is different from the number of the segmented resonators of the second segmented resonator device. For example, the first segmented resonator device includes at least two segmented resonators, and the second segmented resonator device includes a single segmented resonator. Specifically, the number of segmented resonators included in the segmented resonator device Sa, which is the second segmented resonator device, is one, the number of segmented resonators included in the segmented resonator device Sb, which is the first segmented resonator device, is two, the number of segmented resonators included in the segmented resonator device Sc, which is the second segmented resonator device, is one, and the number of segmented resonators included in the segmented resonator device Sd, which is the first segmented resonator device, is two.

That is to say, the segmented resonator device Sa includes a single segmented resonator, and this single segmented resonator is referred to as the segmented resonator device Sa. The segmented resonator device Sb includes the segmented resonators Pb1 and Pb2 that are connected in parallel to each other, and a set of the segmented resonators Pb1 and Pb2 is referred to as the segmented resonator device Sb. The segmented resonator device Sc includes a single segmented resonator, and this single segmented resonator is referred to as the segmented resonator device Sc. The segmented resonator device Sd includes the segmented resonators Pd1 and Pd2 that are connected in parallel to each other, and a set of the segmented resonators Pd1 and Pd2 is referred to as the segmented resonator device Sd.

Figure 2:
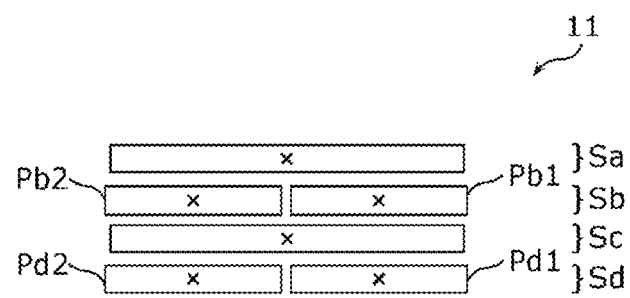
FIG. 2 is a top view illustrating one example of layout of a segmented resonator device group according to a preferred embodiment of the present invention.

Next, a layout of the series arm resonator 11 is described using FIG. 2.

FIG. 2 is a top view illustrating one example of layout of the segmented resonator device group (series arm resonator 11) according to the present preferred embodiment. For example, each of at least three segmented resonator devices (specifically, the segmented resonator devices Sa, Sb, Sc, and Sd included in the series arm resonator 11) includes an InterDigital Transducer (IDT) electrode and is aligned in a direction that crosses an acoustic wave propagation direction. In FIG. 2, the IDT electrode is represented by a square shape, and the illustration of reflectors and the like is omitted.

The acoustic wave propagation direction is the horizontal direction on the page of FIG. 2, and the direction that crosses the acoustic wave propagation direction is, for example, a direction orthogonal to the acoustic wave propagation direction and is the vertical direction on the page of FIG. 2. Note that the direction that crosses the acoustic wave propagation direction does not need to be the direction orthogonal to the acoustic wave propagation direction and may deviate from the vertical direction on the page of FIG. 2.

In the first segmented resonator devices (segmented resonator devices Sb and Sd), at least two segmented resonators (the segmented resonators Pb1 and Pb2 for the segmented resonator device Sb, the segmented resonators Pd1 and Pd2 for the segmented resonator device Sd) are aligned in the acoustic wave propagation direction. For example, the segmented resonators Pb1 and Pb2 and the segmented resonators Pd1 and Pd2 are aligned in the direction (horizontal direction on the page of FIG. 2) orthogonal to the direction (vertical direction on the page of FIG. 2) along which the segmented resonator devices Sa, Sb, Sc, and Sd are aligned.

The segmented resonator devices Sb and Sd may each be divided in such a way that the area of IDT electrode portion thereof becomes equal to that of the case where the segmented resonator device is not divided in parallel. For example, it may be configured in such a way that the area of IDT electrode portion of the segmented resonator device Sb becomes equal to the area of IDT electrode portion of the segmented resonator device Sa in the case where the segmented resonator device Sb is not divided in parallel. Further, it may be configured in such a way that the sum of the area of IDT electrode portion of the segmented resonator Pb1 and the area of IDT electrode portion of the segmented resonator Pb2 becomes equal to the area of IDT electrode portion of the segmented resonator device Sa in the case where the segmented resonator device Sb is divided in parallel. That is to say, it becomes possible to divide the first segmented resonator device in parallel in such a way that the area of the first segmented resonator device does not become greater. In this case, the electric power handling capability can be improved without changing the volume. Note that "the area becomes equal to that of the case where the segmented resonator device is not divided in parallel" means to include the case where the area becomes somewhat larger than that of the case where the segmented resonator device is not divided in parallel by the amount of a gap between segmented resonators that are divided in parallel and reflectors provided between the segmented resonators that are divided in parallel.

In FIG. 2, the symbol "x" denotes a maximum amplitude point of an acoustic wave excited in each IDT electrode. The maximum amplitude point of each IDT electrode is at a center of each IDT electrode in the acoustic wave propagation direction. This is because both ends of the IDT electrode become vibration nodes of an acoustic wave, and the center between these vibration nodes at both ends becomes an anti-node of vibration of the acoustic wave. Note that the maximum amplitude point of an acoustic wave excited by the IDT electrode can be rephrased as the center of the IDT electrode in the acoustic wave propagation direction.

As illustrated in FIG. 2, the maximum amplitude points of acoustic waves excited by the respective IDT electrodes of the first segmented resonator device and the second segmented resonator device, which are adjacent to each other in the direction that crosses the acoustic wave propagation direction in the segmented resonator devices Sa, Sb, Sc, and Sd, are not aligned when seen from the direction orthogonal to the acoustic wave propagation direction. For example, as the first segmented resonator device and the second segmented resonator device that are adjacent to each other, when focused on the segmented resonator devices Sb and Sa, the maximum amplitude points of acoustic waves excited by the IDT electrodes of the segmented resonator device Sb (specifically, the maximum amplitude point of the acoustic wave excited by the IDT electrode of the segmented resonator Pb1 and the maximum amplitude point of the acoustic wave excited by the IDT electrode of the segmented resonator Pb2) and the maximum amplitude point of an acoustic wave excited by the IDT electrode of the segmented resonator device Sa are not aligned when seen from the direction orthogonal to the acoustic wave propagation direction. For example, as the first segmented resonator device and the second segmented resonator device that are adjacent to each other, when focused on the segmented resonator devices Sb and Sc, the maximum amplitude points of acoustic waves excited by the IDT electrodes of the segmented resonator device Sb (specifically, the maximum amplitude point of the acoustic wave excited by the IDT electrode of the segmented resonator Pb1 and the maximum amplitude point of the acoustic wave excited by the IDT electrode of the segmented resonator Pb2) and the maximum amplitude point of an acoustic wave excited by the IDT electrode of the segmented resonator device Sc are not aligned when seen from the direction orthogonal to the acoustic wave propagation direction. For example, as the first segmented resonator device and the second segmented resonator device that are adjacent to each other, when focused on the segmented resonator devices Sd and Sc, the maximum amplitude points of acoustic waves excited by the IDT electrodes of the segmented resonator device Sd (specifically, the maximum amplitude point of the acoustic wave excited by the IDT electrode of the segmented resonator Pd1 and the maximum amplitude point of the acoustic wave excited by the IDT electrode of the segmented resonator Pd2) and the maximum amplitude point of an acoustic wave excited by the IDT electrode of the segmented resonator device Sc are not aligned when seen from the direction orthogonal to the acoustic wave propagation direction.

Because of this, the maximum amplitude points of the first segmented resonator device and the second segmented resonator device that are adjacent to each other are separated from each other. That is to say, the interaction is less likely to occur between the first segmented resonator device and the second segmented resonator device that are adjacent to each other, and thus it becomes possible to reduce or prevent a local temperature increase. How much suppression against the temperature increase can be achieved and how much improvement in electric power handling capability is achieved by not aligning the maximum amplitude points of acoustic waves excited by the respective IDT electrodes of the first segmented resonator device and the second segmented resonator device that are adjacent to each other when seen from the direction orthogonal to the acoustic wave propagation direction are described while comparing with a comparative example.

Figure 3:
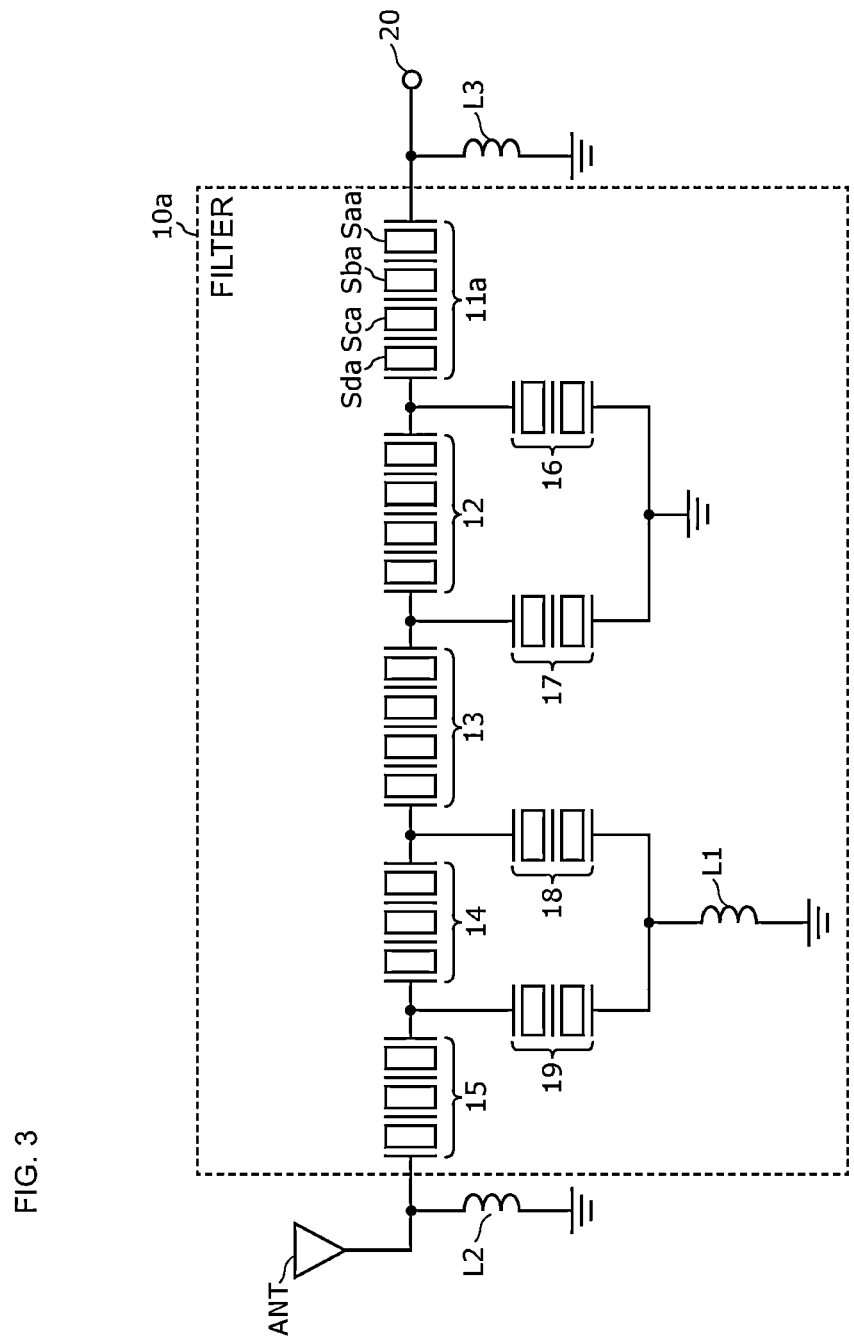
FIG. 3 is a circuit configuration diagram of a filter according to a comparative example.

FIG. 3 is a circuit configuration diagram of a filter 10a according to a comparative example.

The filter 10a according to the comparative example is different from the filter 10 according to the above-described preferred embodiment in that it includes a series arm resonator 11a instead of the series arm resonator 11. The remaining points are the same as those of the filter 10 according to the above-described preferred embodiment, and thus descriptions thereof are omitted.

The series arm resonator 11a is a segmented resonator device group including a plurality of segmented resonator devices that are connected in series to each other. Here, the series arm resonator 11a includes segmented resonator devices Saa, Sba, Sca, and Sda that are connected in series to each other.

Figure 4:
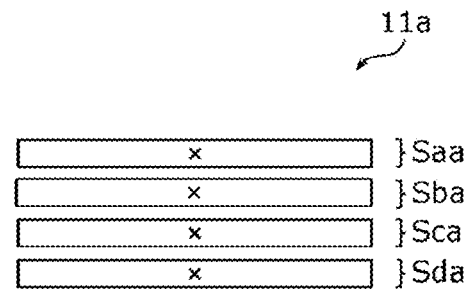
FIG. 4 is a top view illustrating an exemplary layout of a segmented resonator device group according to the comparative example.

FIG. 4 is a top view illustrating an exemplary layout of a segmented resonator device group (series arm resonator 11a) according to the comparative example. The segmented resonator devices Saa, Sba, Sca, and Sda included in the series arm resonator 11a each include an IDT electrode and are aligned in the direction orthogonal to the acoustic wave propagation direction. In FIG. 4, the IDT electrode is represented by a square shape, and the illustration of reflectors and the like is omitted.

The acoustic wave propagation direction is the horizontal direction on the page of FIG. 4, and the direction orthogonal to the acoustic wave propagation direction is the vertical direction on the page of FIG. 4.

In FIG. 4, the symbol "x" denotes a maximum amplitude point of an acoustic wave excited in each IDT electrode. The maximum amplitude point of each IDT electrode is at a center of each IDT electrode in the acoustic wave propagation direction. As illustrated in FIG. 3 and FIG. 4, in the comparative example, the series arm resonator 11a does not include the segmented resonator device that is divided in parallel, and maximum amplitude points of acoustic waves excited by the respective IDT electrodes of the segmented resonator devices Saa, Sba, Sca, and Sda are aligned when seen from the direction orthogonal to the acoustic wave propagation direction.

Figure 5A:
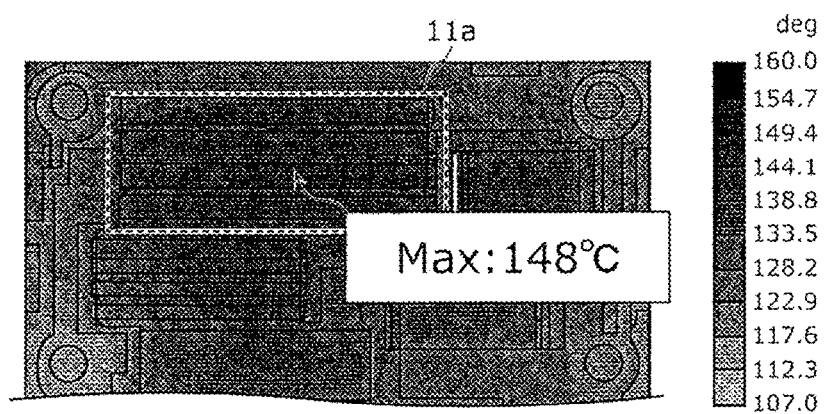
FIG. 5A is a diagram illustrating a temperature distribution of a piezoelectric board included in the filter according to the comparative example.

FIG. 5A is a diagram illustrating a temperature distribution of a piezoelectric board included in the filter 10a according to the comparative example. For example, the filter 10a includes a piezoelectric board, and FIG. 5A illustrate a temperature distribution of the piezoelectric board around the series arm resonator 11a of the filter 10a.

The maximum amplitude points of acoustic waves excited by the respective IDT electrodes of the segmented resonator devices Saa, Sba, Sca, and Sda included in the series arm resonator 11a overlap when seen from the direction orthogonal to the acoustic wave propagation direction. Therefore, the temperature around the series arm resonator 11a is high, and the maximum temperature at a portion of the piezoelectric board of the filter 10a, which is illustrated in FIG. 5A, is 148° C.

Figure 5B:
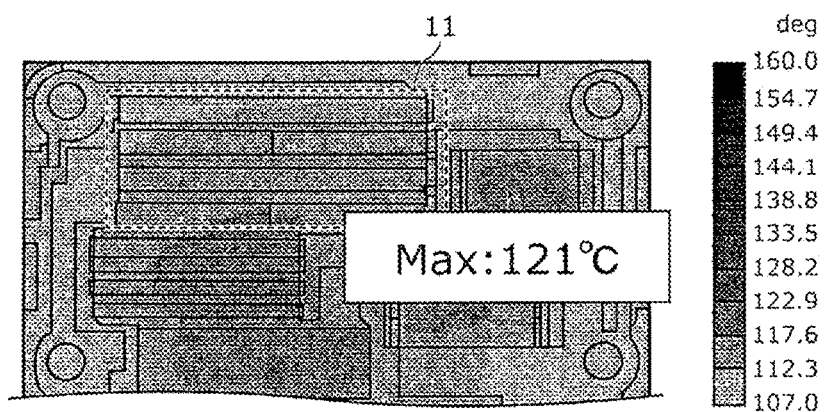
FIG. 5B is a diagram illustrating a temperature distribution of a piezoelectric board included in a filter according to a preferred embodiment of the present invention.

FIG. 5B is a diagram illustrating a temperature distribution of a piezoelectric board included in the filter 10 according to the above-described preferred embodiment. For example, the filter 10 includes a piezoelectric board, and FIG. 5B illustrate a temperature distribution of the piezoelectric board around the series arm resonator 11 of the filter 10.

The maximum amplitude points of acoustic waves excited by the respective IDT electrodes of the first segmented resonator device and the second segmented resonator device, which are adjacent to each other in the segmented resonator devices Sa, Sb, Sc, and Sd included in the series arm resonator 11, are not aligned when seen from the direction orthogonal to the acoustic wave propagation direction. Therefore, the temperature around the series arm resonator 11 is low, and the maximum temperature at a portion of the piezoelectric board forming the filter 10, which is illustrated in FIG. 5B, is 121° C.

As described above, the maximum amplitude points of the first segmented resonator device and the second segmented resonator device that are adjacent to each other are separated from each other. Therefore, the interaction is less likely to occur between the first segmented resonator device and the second segmented resonator device that are adjacent to each other, and it becomes possible to reduce or prevent a local temperature increase.

Figure 6:
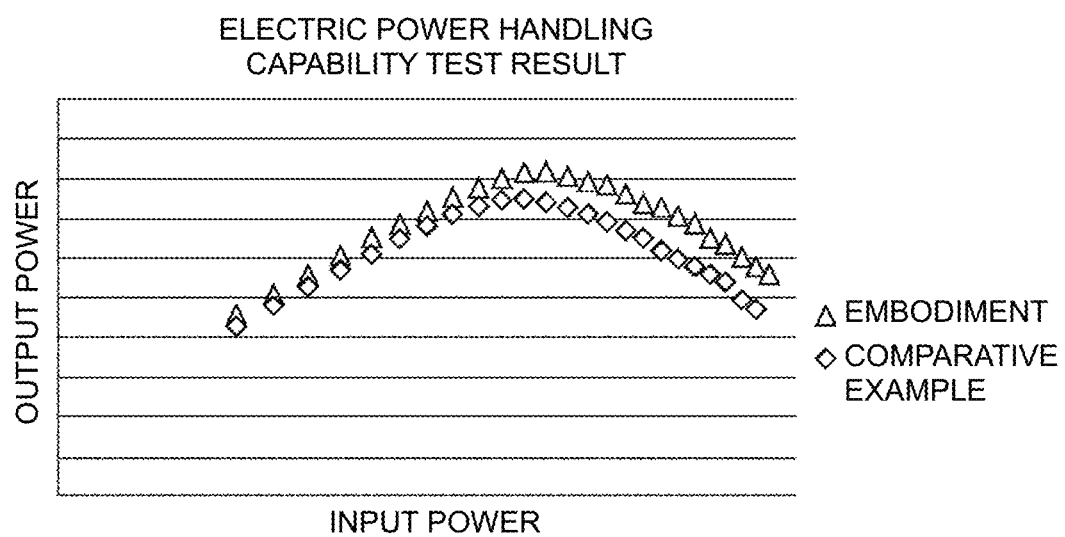
FIG. 6 is a graph illustrating electric power handling capability of a filter according to a preferred embodiment of the present invention and the filter according to the comparative example.

FIG. 6 is a graph illustrating the electric power handling capability of the filter 10 according to a preferred embodiment of the present invention and the filter 10a according to the comparative example. The horizontal axis represents the input power input to each filter, and the vertical axis represents the output power output in response to the input power. Higher output power indicates higher electric power handling capability.

In the filter 10 according to the above-described preferred embodiment, the maximum amplitude points are spread out. Therefore, a local temperature increase is reduced or prevented, and degradation of insertion loss and frequency shifting are reduced or prevented. This improves the output power as illustrated in FIG. 6, and the electric power handling capability of the filter 10 according to the above-described preferred embodiment is improved compared with the filter 10a according to the comparative example. Further, as described above, the segmented resonator device divided in parallel (first segmented resonator device) can be divided in parallel while maintaining the area of IDT electrode portion, and this enables to effectively improve the electric power handling capability while reducing or preventing an increase in the size of the filter 10.

As described above, the filter 10 includes at least three segmented resonator devices that are connected in series to each other, the at least three segmented resonator devices each have an IDT electrode and are aligned in the direction that crosses the acoustic wave propagation direction, and the centers in the acoustic wave propagation direction of the respective IDT electrodes of the first segmented resonator device (for example, the segmented resonator device Sb) and the second segmented resonator device (for example, the segmented resonator device Sa), which are adjacent to each other in the at least three segmented resonator devices, are not aligned when seen from the direction orthogonal to the acoustic wave propagation direction.

With regard to each segmented resonator device, at the center of the IDT electrode in the acoustic wave propagation direction (that is to say, the maximum amplitude point of an acoustic wave excited by the IDT electrode), the excitation is strong, and it is likely to generate heat. When such maximum amplitude points overlap with each other when seen from the direction orthogonal to the acoustic wave propagation direction, it means that the maximum amplitude points of the adjacent segmented resonator devices are close to each other. Due to the interaction between the adjacent segmented resonator devices, temperature is likely to increase locally, and the electric power handling capability of the acoustic wave filter degrades. In contrast, according to the present aspect of a preferred embodiment of the present invention, with regard to the first segmented resonator device and the second segmented resonator device that are adjacent to each other in the direction that crosses the acoustic wave propagation direction, the centers of the IDT electrodes in the acoustic wave propagation direction (that is to say, the maximum amplitude points of acoustic waves excited by the IDT electrodes) are not aligned when seen from the direction orthogonal to the acoustic wave propagation direction. Because of this, the maximum amplitude points of the first segmented resonator device and the second segmented resonator device that are adjacent to each other are separated from each other, the interaction is less likely to occur between the first segmented resonator device and the second segmented resonator device that are adjacent to each other, and thus it becomes possible to reduce or prevent a local temperature increase. Accordingly, it becomes possible to effectively improve the electric power handling capability.

Further, the first segmented resonator device may include at least two segmented resonators that are connected in parallel to each other, and the at least two segmented resonators of the first segmented resonator device may be aligned in the acoustic wave propagation direction.

By dividing the first segmented resonator device in parallel into at least two segmented resonators as described above, it becomes possible to move the maximum amplitude point of the first segmented resonator device from the center of the first segmented resonator device (the center of a set of the at least two segmented resonators) to the respective centers of the at least two segmented resonators having been divided when seen from the direction orthogonal to the acoustic wave propagation direction. In other words, it becomes possible to spread the maximum amplitude point of the first segmented resonator device from the center of the set of the at least two segmented resonators to both end sides of this set. This makes it possible to provide the respective maximum amplitude points of the first segmented resonator device and the second segmented resonator device, which are adjacent to each other, to not be aligned when seen from the direction orthogonal to the acoustic wave propagation direction.

Further, the number of segmented resonators included in the first segmented resonator device may be different from the number of segmented resonators included in the second segmented resonator device. For example, the second segmented resonator device may include only one single segmented resonator.

By making the number of segmented resonators included in the first segmented resonator device different from the number of segmented resonators included in the second segmented resonator device, it becomes possible to facilitate the arrangement of the maximum amplitude point of each segmented resonator in the first segmented resonator device and the maximum amplitude point of each segmented resonator in the second segmented resonator device in such a way that these maximum amplitude points do not align when seen from the direction orthogonal to the acoustic wave propagation direction. For example, by including at least two segmented resonators in the first segmented resonator device, and by including only one single segmented resonator in the second segmented resonator device, the maximum amplitude point in the first segmented resonator device spreads from the center to both end sides of the first segmented resonator device in the acoustic wave propagation direction, and the maximum amplitude point in the second segmented resonator device locates at the center of the second segmented resonator device in the acoustic wave propagation direction. Therefore, it becomes possible to arrange the respective maximum amplitude points of the first segmented resonator device and the second segmented resonator device, which are adjacent to each other, so as not to be aligned when seen from the direction orthogonal to the acoustic wave propagation direction.

Other Preferred Embodiments

Acoustic wave filters according to the present invention have been described above with respect to preferred embodiments. However, the present invention is not limited to the foregoing preferred embodiments. Other preferred embodiments realized by combining optional elements or features of the foregoing preferred embodiments, modified examples obtained by applying various modifications conceivable to those skilled in the art to the foregoing preferred embodiments without departing the scope of the present invention, and various devices including acoustic wave filters according to preferred embodiments of the present invention may also be included in the present invention.

For example, an acoustic wave filter according to a preferred embodiment of the present invention includes at least three segmented resonator devices that are connected in series to each other, and the maximum amplitude points of acoustic waves excited by the respective IDT electrodes of the first segmented resonator device and the second segmented resonator device, which are adjacent to each other in the at least three segmented resonator devices, are not aligned when seen from the direction orthogonal to the acoustic wave propagation direction. However, the way of not aligning the maximum amplitude points is not particularly limited.

For example, the maximum amplitude points may be arranged so as not to align as illustrated in FIGS. 7A to 7E.

Figure 7A:
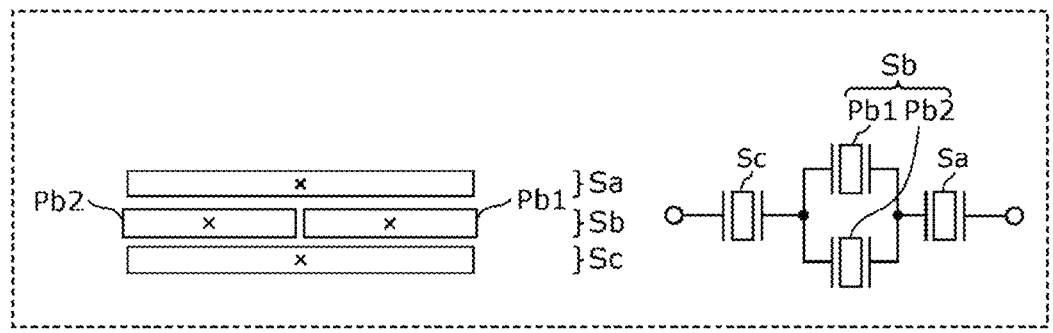
FIG. 7A illustrates examples of layout and circuit configuration of a segmented resonator device group according to another preferred embodiment of the present invention.
Figure 7B:
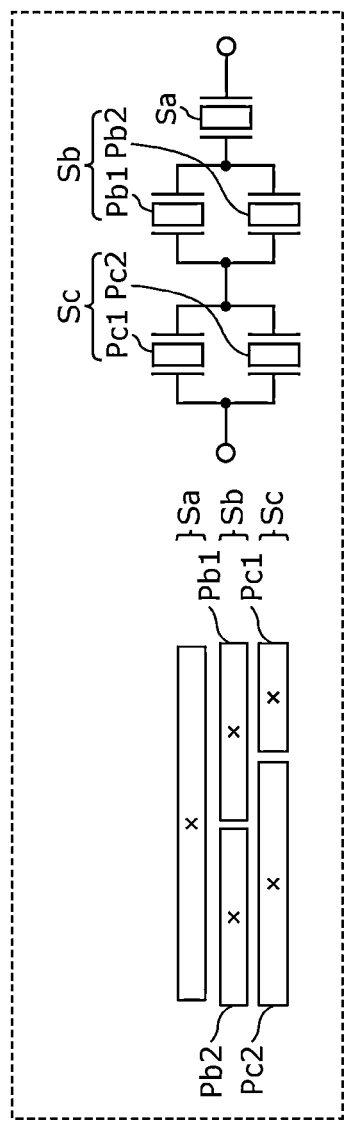
FIG. 7B illustrates examples of layout and circuit configuration of a segmented resonator device group according to another preferred embodiment of the present invention.
Figure 7C:
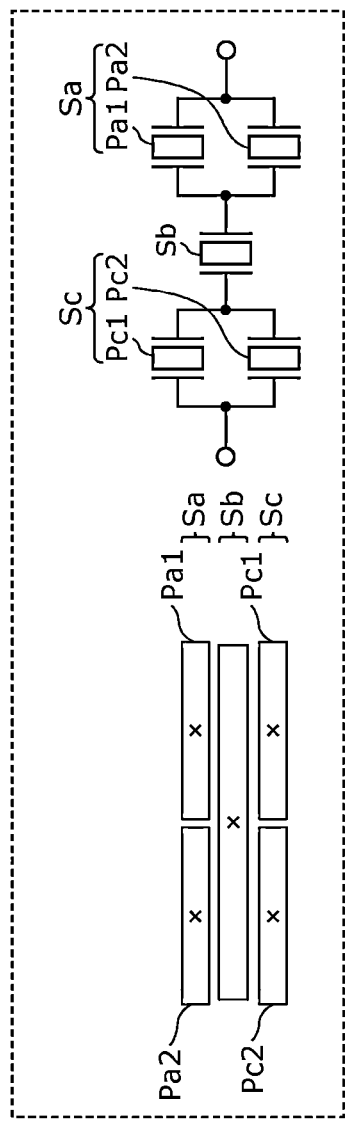
FIG. 7C illustrates examples of layout and circuit configuration of a segmented resonator device group according to another preferred embodiment of the present invention.

FIGS. 7A to 7E illustrate examples of layouts and circuit configurations of segmented resonator device groups according to other preferred embodiments. The layout of a segmented resonator device group is illustrated in the left side of each drawing, and the circuit configuration of the segmented resonator device group is illustrated in the right side of each drawing. Here, examples of a segmented resonator device group including three segmented resonator devices Sa, Sb, and Sc that are connected in series in the order of the segmented resonator devices Sa, Sb, and Sc are illustrated in FIGS. 7A to 7E. In FIGS. 7A to 7E, with regard to adjacent segmented resonator devices Sa and Sb, the segmented resonator device Sa is the second segmented resonator device and the segmented resonator device Sb is the first segmented resonator device, and with regard to adjacent segmented resonator devices Sb and Sc, the segmented resonator device Sb is the first segmented resonator device and the segmented resonator device Sc is the second segmented resonator device. In FIG. 7C, with regard to adjacent segmented resonator devices Sa and Sb, the segmented resonator device Sa is the first segmented resonator device and the segmented resonator device Sb is the second segmented resonator device, and with regard to adjacent segmented resonator devices Sb and Sc, the segmented resonator device Sb is the second segmented resonator device and the segmented resonator device Sc is the first segmented resonator device. On the left sides of FIGS. 7A to 7E, the IDT electrode is represented by a square shape, and the illustration of reflectors and the like is omitted. Further, on the left side of FIGS. 7A to 7E, the symbol "x" denotes a maximum amplitude point of an acoustic wave excited in each IDT electrode. The maximum amplitude point of each IDT electrode is at a center of each IDT electrode in the acoustic wave propagation direction.

As illustrated in FIG. 7A, of the three segmented resonator devices Sa, Sb, and Sc, the segmented resonator device Sb, which is interposed between the segmented resonator device Sa and the segmented resonator device Sc, may be divided in parallel to include segmented resonators Pb1 and Pb2 that are connected in parallel to each other. That is to say, in the segmented resonator device group, segmented resonator devices may be connected in series in the order of the second segmented resonator device including only one single segmented resonator, the first segmented resonator device including two segmented resonators that are connected in parallel to each other, and the second segmented resonator device including a single segmented resonator.

As illustrated in FIG. 7B, of the three segmented resonator devices Sa, Sb, and Sc, each of the adjacent segmented resonator devices Sb and Sc may be divided in parallel to include segmented resonators that are connected in parallel to each other (for the segmented resonator device Sb, segmented resonators Pb1 and Pb2, and for the segmented resonator device Sc, segmented resonators Pc1 and Pc2). That is to say, in the segmented resonator device group, segmented resonator devices may be connected in series in the order of the second segmented resonator device including a single segmented resonator, the first segmented resonator device including two segmented resonators that are connected in parallel to each other, and the second segmented resonator device including two segmented resonators that are connected in parallel to each other.

Further, as illustrated in FIG. 7B, the IDT electrodes included in the segmented resonators Pb1 and Pb2 of the segmented resonator device Sb, which is the first segmented resonator device, and the IDT electrodes included in the segmented resonators Pc1 and Pc2 of the segmented resonator device Sc, which is the second segmented resonator device, may be aligned in the acoustic wave propagation direction. Further, the ratio between the lengths in the acoustic wave propagation direction of the respective IDT electrodes included in the segmented resonators Pb1 and Pb2 of the segmented resonator device Sb, which is the first segmented resonator device, may be different from the ratio between the lengths in the acoustic wave propagation direction of the respective IDT electrodes included in the segmented resonators Pb1 and Pc2 of the segmented resonator device Sc, which is the second segmented resonator device. For example, the ratio between the lengths in the acoustic wave propagation direction of the respective IDT electrodes included in the segmented resonators Pb1 and Pb2 of the segmented resonator device Sb is 1:1, and the ratio between the lengths in the acoustic wave propagation direction of the respective IDT electrodes included in the segmented resonators Pc1 and Pc2 of the segmented resonator device Sc is 1:2.

As illustrated in FIG. 7C, of the three segmented resonator devices Sa, Sb, and Sc, each of the segmented resonator devices Sa and Sc sandwiching the segmented resonator device Sb may be divided in parallel to include segmented resonators that are connected in parallel to each other (for the segmented resonator device Sa, segmented resonators Pa1 and Pa2, and for the segmented resonator device Sc, segmented resonators Pc1 and Pc2). That is to say, in the segmented resonator device group, segmented resonator devices may be connected in series in the order of the first segmented resonator device including two segmented resonators that are connected in parallel to each other, the second segmented resonator device including a single segmented resonator, and the first segmented resonator device including two segmented resonators that are connected in parallel to each other.

Figure 7D:
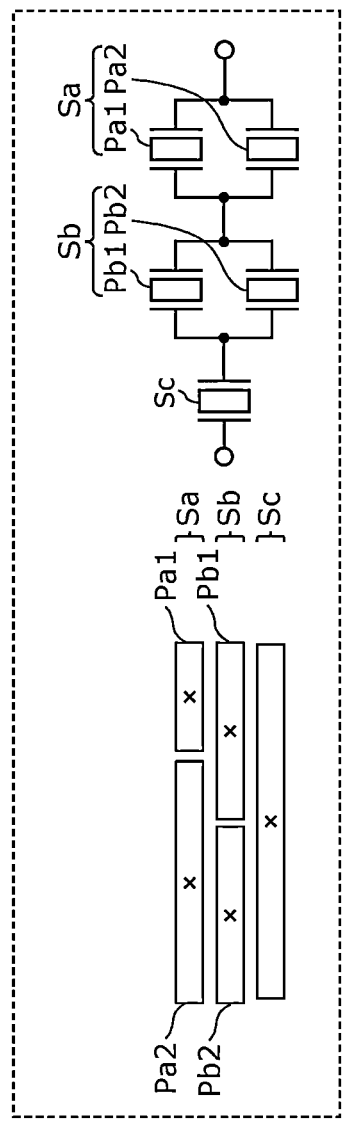
FIG. 7D illustrates examples of layout and circuit configuration of a segmented resonator device group according to another preferred embodiment of the present invention.

As illustrated in FIG. 7D, of the three segmented resonator devices Sa, Sb, and Sc, each of the adjacent segmented resonator devices Sa and Sb may be divided in parallel to include segmented resonators that are connected in parallel to each other (for the segmented resonator device Sa, segmented resonators Pa1 and Pa2, and for the segmented resonator device Sb, segmented resonators Pb1 and Pb2). That is to say, in the segmented resonator device group, segmented resonator devices may be connected in series in the order of the second segmented resonator device including two segmented resonators that are connected in parallel to each other, the first segmented resonator device including two segmented resonators that are connected in parallel to each other, and the second segmented resonator device including only one single segmented resonator.

Further, as illustrated in FIG. 7D, the IDT electrodes included in the segmented resonators Pa1 and Pa2 of the segmented resonator device Sa, which is the second segmented resonator device, and the IDT electrodes included in the segmented resonators Pb1 and Pb2 of the segmented resonator device Sb, which is the first segmented resonator device, may be aligned in the acoustic wave propagation direction. Further, the ratio between the lengths in the acoustic wave propagation direction of the respective IDT electrodes included in the segmented resonators Pa1 and Pa2 of the segmented resonator device Sa, which is the second segmented resonator device, may be different from the ratio between the lengths in the acoustic wave propagation direction of the respective IDT electrodes included in the segmented resonators Pb1 and Pb2 of the segmented resonator device Sb, which is the first segmented resonator device. For example, the ratio between the lengths in the acoustic wave propagation direction of the respective IDT electrodes included in the segmented resonators Pa1 and Pa2 of the segmented resonator device Sa is 1:2, and the ratio between the lengths in the acoustic wave propagation direction of the respective IDT electrodes included in the segmented resonators Pb1 and Pb2 of the segmented resonator device Sb is 1:1.

Figure 7E:
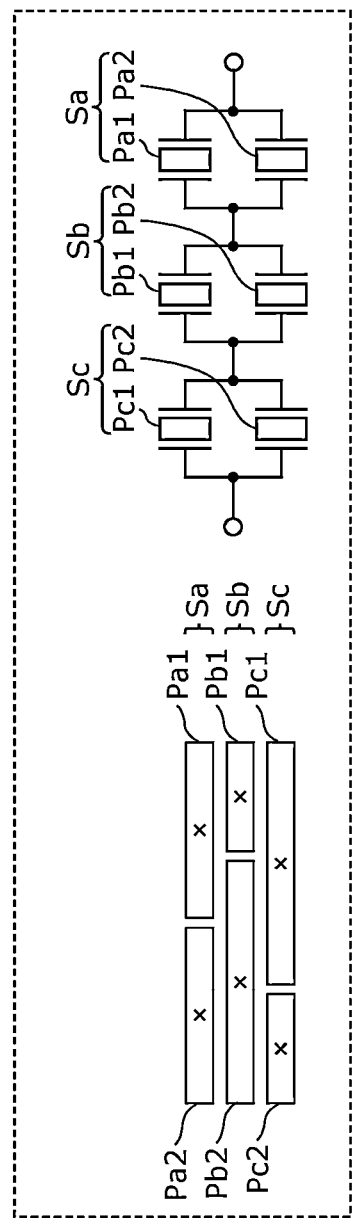
FIG. 7E illustrates examples of layout and circuit configuration of a segmented resonator device group according to another preferred embodiment of the present invention.

As illustrated in FIG. 7E, all the three segmented resonator devices Sa, Sb, and Sc may each be divided in parallel to include segmented resonators that are connected in parallel to each other (for the segmented resonator device Sa, segmented resonators Pa1 and Pa2, for the segmented resonator device Sb, segmented resonators Pb1 and Pb2, and for the segmented resonator device Sc, segmented resonators Pc1 and Pc2). That is to say, in the segmented resonator device group, segmented resonator devices may be connected in series in the order of the second segmented resonator device including two segmented resonators that are connected in parallel to each other, the first segmented resonator device including two segmented resonators that are connected in parallel to each other, and the second segmented resonator device including two segmented resonators that are connected in parallel to each other.

Further, as illustrated in FIG. 7E, the IDT electrodes included in the segmented resonators Pa1 and Pa2 of the segmented resonator device Sa, which is the second segmented resonator device, the IDT electrodes included in the segmented resonators Pb1 and Pb2 of the segmented resonator device Sb, which is the first segmented resonator device, and the IDT electrodes included in the segmented resonators Pc1 and Pc2 of the segmented resonator device Sc, which is the second segmented resonator device, may be aligned in the acoustic wave propagation direction. Further, the ratio between the lengths in the acoustic wave propagation direction of the respective IDT electrodes included in the segmented resonators Pa1 and Pa2 of the segmented resonator device Sa, which is the second segmented resonator device, may be different from the ratio between the lengths in the acoustic wave propagation direction of the respective IDT electrodes included in the segmented resonators Pb1 and Pb2 of the segmented resonator device Sb, which is the first segmented resonator device. For example, the ratio between the lengths in the acoustic wave propagation direction of the respective IDT electrodes included in the segmented resonators Pa1 and Pa2 of the segmented resonator device Sa is 1:1, and the ratio between the lengths in the acoustic wave propagation direction of the respective IDT electrodes included in the segmented resonators Pb1 and Pb2 of the segmented resonator device Sb is 1:2.

Moreover, the ratio between the lengths in the acoustic wave propagation direction of the respective IDT electrodes included in the segmented resonators Pb1 and Pb2 of the segmented resonator device Sb, which is the first segmented resonator device, may be different from the ratio between the lengths in the acoustic wave propagation direction of the respective IDT electrodes included in the segmented resonators Pc1 and Pc2 of the segmented resonator device Sc, which is the second segmented resonator device. For example, the ratio between the lengths in the acoustic wave propagation direction of the respective IDT electrodes included in the segmented resonators Pb1 and Pb2 of the segmented resonator device Sb is 1:2, and the ratio between the lengths in the acoustic wave propagation direction of the respective IDT electrodes included in the segmented resonators Pc1 and Pc2 of the segmented resonator device Sc is 2:1. Note that here it is assumed that 1:2 and 2:1 are different.

As illustrated in FIGS. 7B, 7D, and 7E, the second segmented resonator device does not need to include only one single segmented resonator but may include at least two segmented resonators that are connected in parallel to each other. Further, at least two segmented resonators of the second segmented resonator device may be aligned in the acoustic wave propagation direction, and the ratio between the lengths in the acoustic wave propagation direction of the respective IDT electrodes included in at least two segmented resonators of the first segmented resonator device may be different from the ratio between the lengths in the acoustic wave propagation direction of the respective IDT electrodes included in at least two segmented resonators of the second segmented resonator device.

According to this, by making the ratio between the lengths in the acoustic wave propagation direction of the IDT electrodes included in the respective segmented resonators of the first segmented resonator device different from that of the second segmented resonator device, it becomes possible to facilitate the arrangement of the maximum amplitude point of each segmented resonator in the first segmented resonator device and the maximum amplitude point of each segmented resonator in the second segmented resonator device in such a way that these maximum amplitude points do not align when seen from the direction orthogonal to the acoustic wave propagation direction. Particularly, the number of segmented resonators included in the first segmented resonator device may be equal to the number of segmented resonators included in the second segmented resonator device, and even in such a case, by having different ratios of the lengths as described above, the maximum amplitude points can be arranged so as not to align.

Further, for example, in order to arrange the maximum amplitude points so as not to align, it is not necessary to provide a segmented resonator device with at least two segmented resonators that are divided in parallel. For example, of at least three segmented resonator devices that are included in an acoustic wave filter and are connected in series to each other, the first segmented resonator device and the second segmented resonator device that are adjacent to each other may each include a single segmented resonator, and in each of the segmented resonators, the IDT electrode may have a different length in the acoustic wave propagation direction. This is because, by having different lengths of the IDT electrodes in the acoustic wave propagation direction for the first segmented resonator device and the second segmented resonator device, their maximum amplitude points (that is to say, the centers of the respective IDT electrodes in the acoustic wave propagation direction) do not align when seen from the direction orthogonal to the acoustic wave propagation direction.

Further, for example, the number of at least three segmented resonator devices included in the acoustic wave filter is not limited to any particular number so long as the number is higher than or equal to three.

Further, in the case where the first segmented resonator device and the second segmented resonator device each include at least two segmented resonators that are connected in parallel to each other, each of the first segmented resonator device and the second segmented resonator device does not need to include only two segmented resonators that are connected in parallel to each other and may include three or more segmented resonators that are connected in parallel to each other.

Preferred embodiments of the present invention can be widely used for communication devices such as mobile phones and the like, each including an acoustic wave filter including segmented resonator devices.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. An acoustic wave filter comprising:
 at least three segmented resonator devices connected in series to one another and aligned in a direction that crosses an acoustic wave propagation direction; wherein
 each of the at least three segmented resonator devices includes an InterDigital Transducer (IDT) electrode;

centers of respective IDT electrodes of an adjacent pair of the at least three segmented resonator devices in the acoustic wave propagation direction are not aligned when seen from a direction orthogonal to the acoustic wave propagation direction;

the first segmented resonator device includes at least two segmented resonators that are connected in parallel to one another;

the at least two segmented resonators of the first segmented resonator device are aligned in the acoustic wave propagation direction;

the second segmented resonator device includes at least two segmented resonators that are connected in parallel to one another;

the at least two segmented resonators of the second segmented resonator device are aligned in the acoustic wave propagation direction; and a ratio between lengths in the acoustic wave propagation direction of the respective IDT electrodes included in the at least two segmented resonators of the first segmented resonator device is different from a ratio between lengths in the acoustic wave propagation direction of the respective IDT electrodes included in the at leasttwo segmented resonators of the second segmented resonator device --.

2. The acoustic wave filter according to claim 1, wherein a number of the segmented resonators included in the first segmented resonator device is different from a number of the segmented resonators included in the third segmented resonator device.

3. The acoustic wave filter according to claim 2, wherein the third segmented resonator device includes only one single segmented resonator.

4. The acoustic wave filter according to claim 1, wherein each of the at least three segmented resonator devices is a surface acoustic wave resonator.

5. The acoustic wave filter according to claim 1, wherein each of the at least three segmented resonator devices is a bulk acoustic wave resonator.

6. The acoustic wave filter according to claim 1, wherein each of the at least three segmented resonator devices is a resonator that uses one of a surface wave, a Love wave, a leaky wave, a Rayleigh wave, a boundary wave, a leaky surface acoustic wave, a pseudo surface acoustic wave, and a plate wave.

7. The acoustic wave filter according to claim 1, wherein the at least three segmented resonator devices includes series arm resonators and parallel arm resonators.

8. The acoustic wave filter according to claim 7, further comprising an inductor or a capacitor to adjust a pass band of the acoustic wave filter.

9. The acoustic wave filter according to claim 1, wherein the acoustic wave filter is a ladder acoustic wave filter.

10. The acoustic wave filter according to claim 1, wherein no other element is connected between the adjacent pair of the at least three segmented resonator devices.

11. The acoustic wave filter according to claim 1, wherein an area of the IDT electrode of a first of the at least three segmented resonator devices is equal to an area of the IDT electrode of a second of the at least three segmented resonator devices in a case where the first of the at least three segmented resonator devices is not divided in parallel.

12. The acoustic wave filter according to claim 11, wherein a sum of the area of the IDT electrode of the first of the at least three segmented resonator devices and the area of the IDT electrode of the second of the at least three segmented resonator devices is equal to the area of the second of the at least three segmented resonator devices in a case where the first of the at least three segmented resonator devices is divided in parallel.

13. The acoustic wave filter according to claim 1, wherein maximum amplitude points of acoustic waves excited by the IDT electrodes of the adjacent pair of the at least three segmented resonator devices are not aligned when seen from the direction orthogonal to the acoustic wave propagation direction.

14. The acoustic wave filter according to claim 1, wherein one of the at least three segmented resonator devices is interposed between another two of the at least three segmented resonator devices and divided in parallel to include two segmented resonators connected in parallel to each other.

15. A communication device comprising:

the acoustic wave filter according to claim 1;

an antenna; and an inductor connected to the acoustic wave filter and the antenna.

16. The communication device according to claim 15, wherein the inductor is included in a matching circuit to provide impedance matching between the acoustic wave filter and the antenna.

17. The communication device according to claim 15, wherein the communication device is configured to transmit and receive radio frequency signals.

18. The communication device according to claim 15, wherein the communication device is configured to communicate in accordance with the Long Term Evolution communication standard.

* * * * *